(12) United States Patent
Nakamura et al.

(10) Patent No.: US 7,696,613 B2
(45) Date of Patent: Apr. 13, 2010

(54) MULTILAYERED WIRING SUBSTRATE INCLUDING WIRING LAYERS AND INSULATING LAYERS AND METHOD OF MANUFACTURING THE SAME

(75) Inventors: Junichi Nakamura, Nagano (JP); Kinji Nagata, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 150 days.

(21) Appl. No.: 11/515,803

(22) Filed: Sep. 6, 2006

(65) Prior Publication Data
US 2007/0057363 A1 Mar. 15, 2007

(30) Foreign Application Priority Data
Sep. 7, 2005 (JP) .......................... P2005-259724

(51) Int. Cl.
- *H01L 23/04* (2006.01)
- *H01L 23/498* (2006.01)
- *H01L 23/12* (2006.01)
- *B32B 25/10* (2006.01)
- *H05K 3/46* (2006.01)
- *H05K 1/02* (2006.01)

(52) U.S. Cl. .............................. 257/668; 257/E23.175; 257/E23.062; 257/700; 257/701; 257/758; 257/698; 257/773; 257/776

(58) Field of Classification Search .......... 257/E23.175, 257/E23.062, 668, 758, 700, 698, 773, 774, 257/776, 775, 701; 438/666; 442/399
See application file for complete search history.

(56) References Cited

U.S. PATENT DOCUMENTS

| | | | | |
|---|---|---|---|---|
| 4,425,380 A | * | 1/1984 | Nuzzi et al. ................ | 427/97.2 |
| 5,495,665 A | * | 3/1996 | Carpenter et al. ............. | 29/830 |
| 5,505,321 A | * | 4/1996 | Caron et al. ................... | 216/20 |
| 5,615,088 A | | 3/1997 | Mizumo ..................... | 361/749 |
| 6,388,865 B1 | * | 5/2002 | Honda et al. ................ | 361/311 |
| 6,736,988 B1 | * | 5/2004 | Gaku et al. ................... | 216/65 |
| 7,222,421 B2 | * | 5/2007 | Nakamura .................... | 29/830 |
| 2003/0173640 A1 | * | 9/2003 | Ando et al. ................. | 257/508 |
| 2004/0241415 A1 | * | 12/2004 | Wadahara et al. ......... | 428/298.1 |
| 2004/0256727 A1 | * | 12/2004 | Aoyagi et al. ............... | 257/758 |
| 2005/0155222 A1 | * | 7/2005 | Nakamura .................... | 29/830 |
| 2006/0012048 A1 | * | 1/2006 | Murai et al. ................. | 257/758 |
| 2006/0014463 A1 | * | 1/2006 | Yoshida ....................... | 442/399 |
| 2007/0108588 A1 | * | 5/2007 | Shimada et al. ............. | 257/691 |
| 2007/0130762 A1 | * | 6/2007 | Nakamura .................... | 29/830 |

FOREIGN PATENT DOCUMENTS

| CN | 1392601 | 1/2003 |
|---|---|---|
| JP | 6-334279 | 12/1994 |

(Continued)

*Primary Examiner*—Alexander O Williams
(74) *Attorney, Agent, or Firm*—Drinker Biddle & Reath LLP (57) ABSTRACT

A multilayered wiring substrate is constructed by stacking wiring layers 105, 108, 110, 112 and insulating layers 104, 106, 107, 109 in predetermined number, with at least one of the wiring layers being formed as a reinforcing wiring layer 103 whose thickness is 35 to 150 μm arranged in one layer or plural layers. Also, the thickness of the reinforcing wiring layer is larger than that of the other wiring layers.

6 Claims, 8 Drawing Sheets

FOREIGN PATENT DOCUMENTS

| | | |
|---|---|---|
| JP | 10-125818 | 5/1998 |
| JP | 2000-068328 | 3/2000 |
| JP | 2002-064271 | 2/2002 |
| JP | 2005-101041 | 4/2005 |
| WO | 03/039219 | 5/2003 |

* cited by examiner

MULTILAYERED WIRING SUBSTRATE INCLUDING WIRING LAYERS AND INSULATING LAYERS AND METHOD OF MANUFACTURING THE SAME

TECHNICAL FIELD

The present disclosure relates to a multilayered wiring substrate and a method of manufacturing the same and, more particularly, a multilayered wiring substrate to which a reinforcing means is provided to prevent a warpage and a method of manufacturing the same.

RELATED ART

The improvements in performance and size of the electronic device using the semiconductor device such as the semiconductor chip, or the like are proceeding nowadays. Accordingly, the integration density of the semiconductor device is increased and also a tendency to grow multiple pins and a downsizing is sought. As the substrate on which the semiconductor device whose number of pins are increased and whose size is reduced is mounted, the multilayered wiring substrate using the built-up method is provided.

The multilayered wiring substrate of this type is constructed such that the reinforcing member such as the woven glass fabric copper-clad laminate, or the like is used as the core layer, and then the insulating layer and the wiring layer are formed alternately on both surfaces of the core layer respectively. Because fine wiring layers can be formed on the multilayered wiring substrate having this configuration, the highly integrated semiconductor device can be mounted thereon.

However, since this multilayered wiring substrate has the core layer in the inside, there exists such a problem that it is difficult to miniaturize through holes formed in the core layer and the higher density of the overall multilayered wiring substrate cannot be achieved. Also, there existed such a problem that, because the core layer is provided, the multilayered wiring substrate becomes thick inevitably and thus a reduction in size of the electronic device is hindered. For this reason, in the multilayered wiring substrate utilizing the built-up method, the development of the multilayered wiring substrate having no core layer is advanced recently (see Patent Literature 1: International Publication WO2003/039219, and Patent Literature 2: Japanese Patent Unexamined Publication No. Hei. 10-125818).

Figure 14:
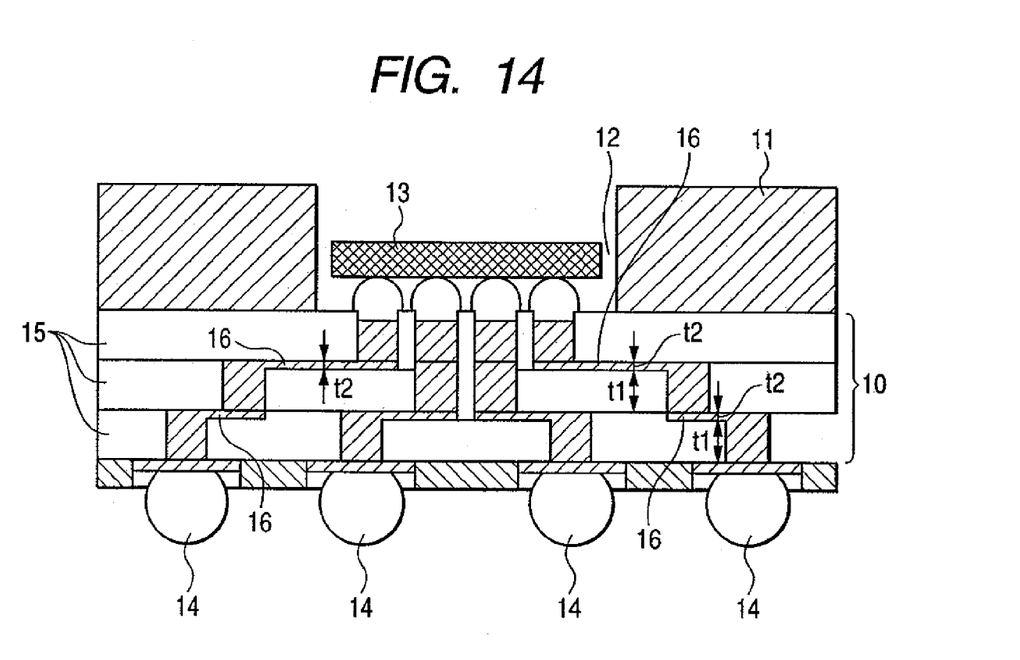
FIG. 14 is a sectional view showing a multilayered wiring substrate as an example in the related art.

FIG. 14 shows an example where a multilayered wiring substrate 10 having no core layer is used as the semiconductor package in the related art. In the example shown in FIG. 14, a semiconductor element 13 is mounted on an upper portion of the multilayered wiring substrate 10, and solder balls 14 are arranged on the lower portion of the substrate 10. Also, all thicknesses t1 of insulating layers 15 are set equal, and also all thicknesses t2 of wiring layers 16 are set equal in respective layers. As shown in FIG. 14, because no core layer is formed, a reduction in thickness of the multilayered wiring substrate 10 can be attained.

However, when the core layer acting as the reinforcing member is merely removed, there is such a problem that a warpage of the multilayered wiring substrate is generated due to a difference in thermal expansion between the insulating layer made of a resin and the wiring layer made of metal, and the like. In case such warpage is generated, the semiconductor element, and the like cannot be properly mounted on the multilayered wiring substrate in the mounting step, and also it is difficult to package the semiconductor package into the packaging substrate. Therefore, the packaging reliability is lowered. Also, an interlayer connection of the wiring layers cannot be surely built up in the multilayered wiring substrate, and it is feared that the reliability of the multilayered wiring substrate is also lowered.

Therefore, as shown in FIG. 14, such a configuration has been proposed that a reinforcing plate 11 in which an opening portion 12 is formed in a semiconductor mounting area is arranged on the multilayered wiring substrate 10 and thus the multilayered wiring substrate 10 is reinforced by this reinforcing plate 11. However, in the multilayered wiring substrate 10 having this configuration, the number of members is increased and also the multilayered wiring substrate 10 is thickened by a thickness of the reinforcing plate 11.

SUMMARY

Embodiments of the present invention provide a multilayered wiring substrate capable of suppressing generation of a warpage while seeking a reduction in thickness and a method of manufacturing the same.

According to a first aspect of one or more embodiments of the invention, there is provided a multilayered wiring substrate comprising wiring layers and insulating layers which are stacked in predetermined number, wherein at least one of he wiring layers is formed as a reinforcing wiring layer whose thickness is 35 to 150 µm.

According to the first aspect of the present invention, the reinforcing wiring layer whose thickness is set to 35 to 150 µm can execute two functions of a function as the wiring layer and a function of suppressing generation of a warpage. Therefore, generation of a warpage can be suppressed without use of other reinforcing member, or the like, and also generation of the warpage can be suppressed while seeking a reduction in thickness of the multilayered wiring substrate.

Also, in the first aspect of the present invention, a ratio (T1/T2) of the reinforcing wiring layer to the insulating layer is set to $1 \leq (T1/T2) \leq 5$, where T1 is a thickness of the reinforcing wiring layer and T2 is a thickness of the insulating layer.

According to the present invention, a warpage generated in the multilayered wiring substrate can be prevented effectively.

Also, in the first aspect of the present invention, the insulating layer may be formed of a resin.

Also, in the first aspect of the present invention, the reinforcing wiring layer may be formed of copper.

Also, according to a second aspect of one or more embodiments of the invention, there is provided a method of manufacturing a multilayered wiring substrate, comprising steps of applying a step to form an insulating layer by using a resin and a step to form a wiring layer respectively onto a supporting substrate at predetermined times; and a step of removing the supporting substrate, wherein, in the step to form the wiring layer, at least one of the wiring layers is formed as a reinforcing wiring layer whose thickness is 35 to 150 µm.

According to the second aspect of the present invention, because the thickness of the reinforcing wiring layer is set to 35 to 150 µm, which is thicker than the normal thickness, in the step that is always applied to form the wiring in the steps of manufacturing the multilayered wiring substrate, the warpage of the multilayered wiring substrate can be suppressed. Therefore, there is no need to change the manufacturing steps and the manufacturing equipment, and thus the multilayered wiring substrate a warpage of which is not generated can be manufactured at a low cost.

Various implementations may include one or more the following advantages. For example, generation of the warpage of the multilayered wiring substrate can be suppressed while seeking a reduction in thickness of the substrate.

Other features and advantages may be apparent from the following detailed description, the accompanying drawings and the claims.

BRIEF DESCRIPTION OF THE DRAWINGS

FIGS. 10A to 10D are views (#1) explaining a method of manufacturing a multilayered wiring substrate as an embodiment of the present invention along manufacturing procedures.

DETAILED DESCRIPTION

Next, a best mode for carrying out the invention will be explained in line with the drawings hereinafter.

Figure 1:
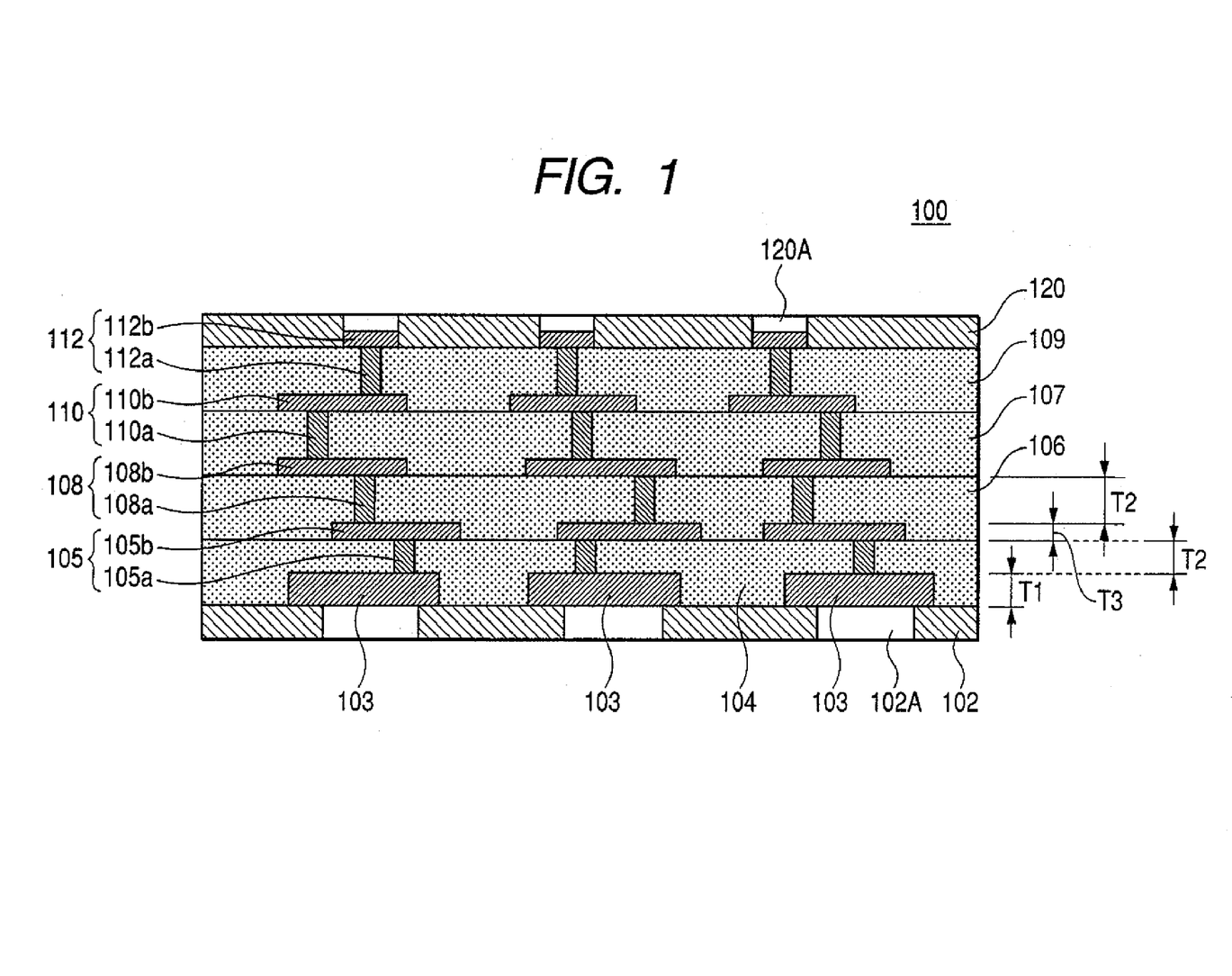
FIG. 1 is a sectional view showing a multilayered wiring substrate as an embodiment of the present invention.

FIG. 1 shows a multilayered wiring substrate 100 as an embodiment of the present invention. As shown in FIG. 1, in the present embodiment, explanation will be made hereunder while taking the multilayered wiring substrate 100 having a five-layered structure as an example. However, the application of the invention of this application is not limited to the five-layered structure, and the present invention can be applied widely to the multilayered wiring substrate 100 having various numbers of layers.

The multilayered wiring substrate 100 is constructed by stacking reinforcing wiring layers 103, a first insulating layer 104, wirings 105, a second insulating layer 106, wirings 108, a third insulating layer 107, wirings 110, a fourth insulating layer 109, and wirings 112, when classified roughly, from the lower layer to the upper layer sequentially. Also, a solder resist 102 is formed on a lower surface of the first insulating layer 104, and a solder resist 120 is formed on an upper surface of the fourth insulating layer 109.

Respective insulating layers 104, 106, 107, 109 are made of an epoxy-based built-up resin having a thermosetting property, for example. Thicknesses T2 of the insulating layers 104, 106, 107,109 are set equal in all layers, and can be set in a range of 30 to 40 μm. In the present embodiment, the thickness T2 is set to 30 μm as an example. Here, the thickness T2 of the insulating layer means a thickness of the resin (insulating layer) that exits between the underlying wiring layer and the overlying wiring layer.

The built-up resin is not limited to the thermosetting built-up resin, but the photosensitive built-up resin and other insulating resins can also be employed.

Meanwhile, respective wirings 103, 105, 108, 110, 112 are formed of copper (Cu), for example. A thickness of the reinforcing wiring layer 103 is set thicker than thicknesses of other wirings 105, 108, 110, 112, as described later. In the present embodiment, the wiring layer whose thickness is large is provided to the lowermost layer as the reinforcing wiring layer 103. But the position in which the reinforcing wiring layer whose thickness is large should be arranged is not limited to the lowermost layer. The reinforcing wiring layer can be provided to other layers, as explained with reference to FIG. 7 to FIG. 9.

The wiring 105 is constructed by a via plug portion 105a and a pattern wiring portion 105b. The via plug portion 105a is formed in an opening portion 104A (see FIG. 10D) formed in the first insulating layer 104, and the pattern wiring portion 105b is formed on an upper surface of the first insulating layer 104 in FIG. 1.

In FIG. 1, an upper end of the via plug portion 105a is connected to the pattern wiring portion 105b, and a lower end of the via plug portion 105a is connected to the reinforcing wiring layer 103. The reinforcing wiring layer 103 is formed to oppose partially to an opening portion 102A of the solder resist 102 that is formed on a lower surface of the first insulating layer 104. This reinforcing wiring layer 103 acts as the reinforcing member to prevent a warpage of the multilayered wiring substrate 100, as described later, and also acts as the external connection terminal. Also, the solder balls, or the like are provided, as the case may be (in the present embodiment, they are not provided).

The wiring 108 is constructed by a via plug portion 108a, and a pattern wiring portion 108b. The via plug portion 108a is formed in an opening portion 106A (see FIG. 11B) formed in the second insulating layer 106, and the pattern wiring portion 108b is formed on an upper surface of the second insulating layer 106 in FIG. 1. An upper end of the via plug portion 108a is connected to the pattern wiring portion 108b in FIG. 1, and a lower end portion of the same is connected to the pattern wiring portion 105b of the wiring 105.

The wiring 110 is constructed by a via plug portion 110a, and a pattern wiring portion 110b. The via plug portion 110a is formed in an opening portion 107A (see FIG. 11D) formed in the third insulating layer 107, and the pattern wiring portion 110b is formed on an upper surface of the third insulating layer 107 in FIG. 1. An upper end of the via plug portion 110a is connected to the pattern wiring portion 110b in FIG. 1, and a lower end portion of the same is connected to the pattern wiring portion 108b of the wiring 108.

The wiring 112 is constructed by a via plug portion 112a, and a pattern wiring portion 112b. The via plug portion 112a is formed in an opening portion 109A (see FIG. 12B) formed in the fourth insulating layer 109, and the pattern wiring portion 112b is formed on an upper surface of the fourth insulating layer 109 in FIG. 1.

A position where a part of the pattern wiring portion 112b is formed is set to oppose to an opening portion 120A in the solder resist 120 that is formed on an upper surface of the fourth insulating layer 109. Therefore, the pattern wiring portion 112b is constructed such that a part of the pattern wiring portion 112b is exposed from the solder resist 120 via the opening portion 120A. A portion of the pattern wiring portion 112b exposed from the opening portion 120A functions as the external connection terminal. For example, the semiconductor element, or the like is connected to the pattern wiring portion 112b (in the present embodiment, no element is provided).

Then, the reinforcing wiring layer 103 will be explained in detail hereunder. The reinforcing wiring layer 103 is made of copper, like other wirings 105, 108, 110, 112. Normally, thicknesses T3 of the pattern wiring portions 105b, 108b, 110b, 112b used as an interlayer wiring in the multilayered wiring substrate 100 are almost 10 to 20 μm. In the present embodiment, the thickness T3 is set to about 12 μm as an example. This thickness is set mainly from an aspect of the electrical property.

In contrast, a thickness of the reinforcing wiring layer 103 is set to about 35 to 150 μm. In the present embodiment, such a configuration is shown that only one layer of the reinforcing wiring layer 103 is provided. However, the number of the reinforcing wiring layer 103 is not limited to one layer, as described later, and plural layers can be provided The reinforcing wiring layer 103 is formed of copper (Cu) as the metal, as described above. A rigidity of the reinforcing wiring layer 103 is higher than the built-up resin constituting respective insulating layers 104, 106, 107, 109. If the thickness of this reinforcing wiring layer 103 is set larger than the thickness (about 12 μm) of the ordinary pattern wiring portions 105b, 108b, 110b, 112b, such reinforcing wiring layer 103 can be used as the reinforcing member that suppresses generation of a warpage of the multilayered wiring substrate 100.

In other words, the multilayered wiring substrate 100 according to the present embodiment is constructed such that the reinforcing wiring layer 103 has both the function as the wiring layer (electrical function) and the function of suppressing generation of a warpage (mechanical function). Therefore, in the multilayered wiring substrate 100 according to the present embodiment, generation of a warpage can be suppressed without use of other reinforcing member, or the like, and as a result the generation of a warpage can be suppressed while seeking a reduction in thickness.

Preferably an area of the reinforcing wiring layer 103 (an area of the pattern wiring portion when the reinforcing wiring layer is composed of the via plug portion and the pattern wiring portion) should be set larger because the reinforcing effect can be enhanced. Therefore, it is desirable that the reinforcing wiring layer should be formed of the solid wiring pattern portion such as the ground plane, the power plane, or the like.

Also, as the reinforcing wiring layer, a frame-like pattern wiring portion may be provided in an area corresponding to the peripheral portion of the multilayered wiring substrate.

Also, in addition to the pattern wiring portion that passes an electric signal, a dummy pattern wiring portion (which is not electrically connected to other pattern wiring portion) to increase an area of the reinforcing wiring layer may be provided in the reinforcing wiring layer. In addition, this frame-like pattern wiring portion and this dummy pattern wiring portion may be connected to the power supply line or the ground line.

Here, a warpage of the multilayered wiring substrate generated when a thickness of the reinforcing wiring layer is changed and when an arranged position and the arranged number of the reinforcing wiring layer are changed will be explained with reference to FIG. 2 to FIG. 9 hereunder.

Figure 2:
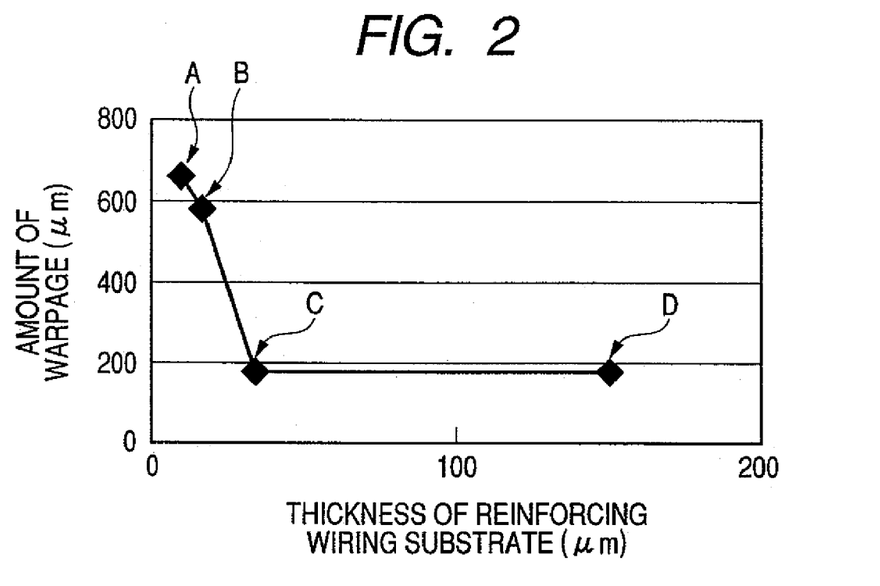
FIG. 2 is a view showing a relationship between an amount of warpage of a multilayered wiring substrate shown in FIG. 6 and a thickness of a reinforcing wiring layer.
Figure 3:
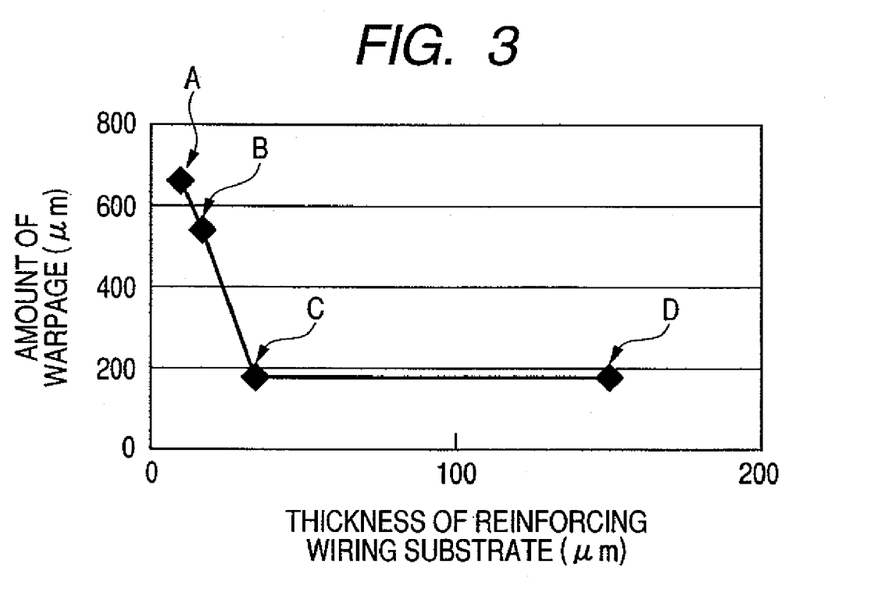
FIG. 3 is a view showing a relationship between an amount of warpage of a multilayered wiring substrate shown in FIG. 7 and a thickness of a reinforcing wiring layer.
Figure 4:
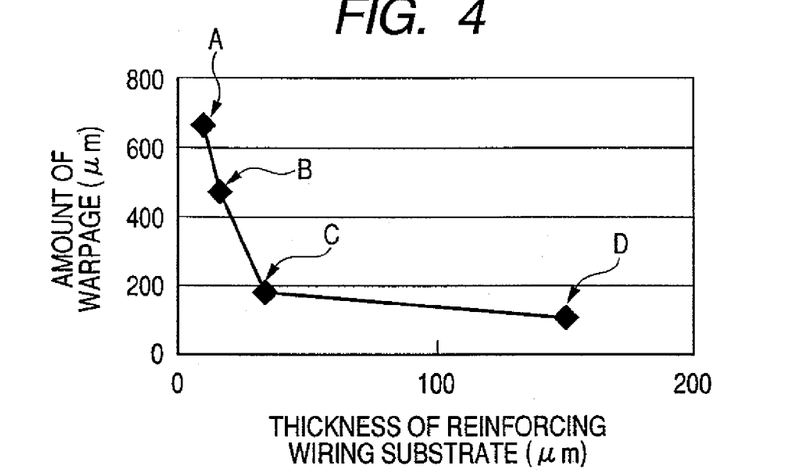
FIG. 4 is a view showing a relationship between an amount of warpage of a multilayered wiring substrate shown in FIG. 8 and a thickness of a reinforcing wiring layer.

In FIG. 2 to FIG. 4, an ordinate shows an amount of warpage generated in the multilayered wiring substrate, and an abscissa shows a thickness of the reinforcing wiring layer. FIG. 2 to FIG. 4 show measured results of an amount of warpage generated in test pieces each having a size of 40 mm×40 mm. FIG. 2 shows the characteristic of the multilayered wiring substrate shown in FIG. 6. Concretely, FIG. 2 shows the characteristic of the multilayered wiring substrate in which a reinforcing wiring layer 117 that is thicker than a wiring 116 is provided in the lowermost layer.

Figure 7:
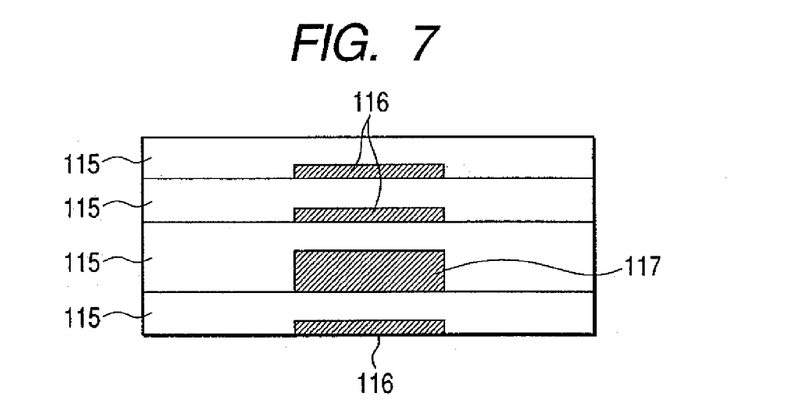
FIG. 7 is a schematic configurative view showing a multilayered wiring substrate in which a second lowermost wiring layer is used as a reinforcing wiring layer.

Also, FIG. 3 shows the characteristic of the multilayered wiring substrate shown in FIG. 7. Concretely, FIG. 3 shows the characteristic of the multilayered wiring substrate in which the reinforcing wiring layer 117 that is thicker than the wiring 116 is provided in the second lowermost layer. Also, FIG. 4 shows the characteristic of the multilayered wiring substrate shown in FIG. 8. Concretely, FIG. 4 shows the characteristic of the multilayered wiring substrate in which the reinforcing wiring layers 117 that are thicker than the wiring 116 are provided in the lowermost layer and the second lowermost layer.

Figure 6:
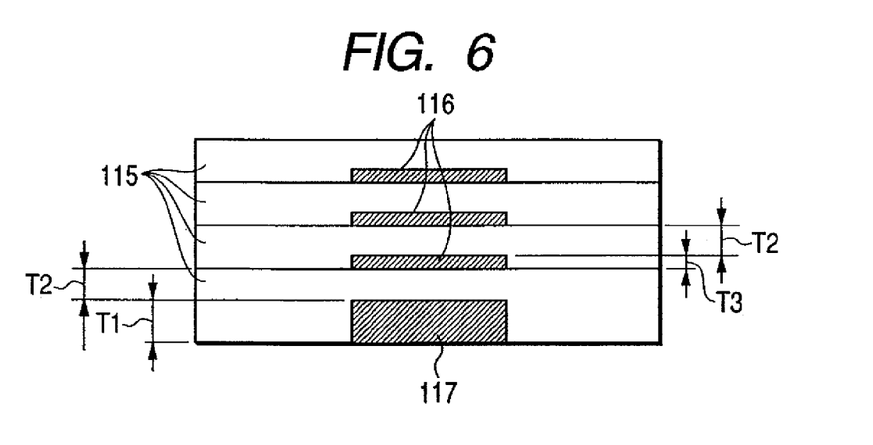
FIG. 6 is a schematic configurative view showing a multilayered wiring substrate in which a lowermost wiring layer is used as a reinforcing wiring layer.
Figure 8:
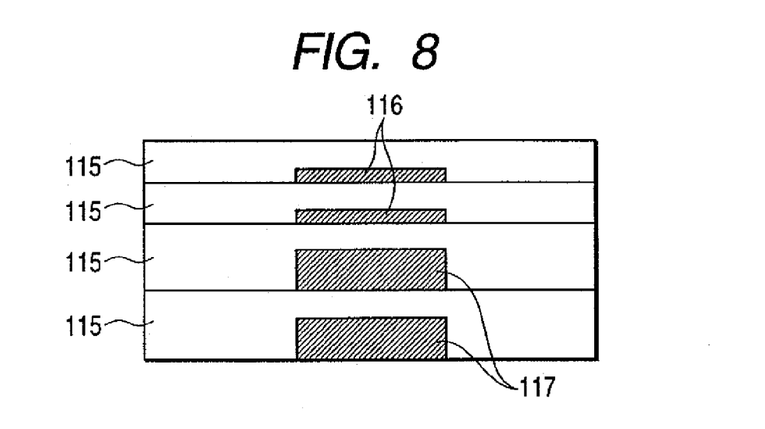
FIG. 8 is a schematic configurative view showing a multilayered wiring substrate in which lowermost and second lowermost wiring layers are used as a reinforcing wiring layer.

As shown in FIG. 6 to FIG. 8, all the multilayered wiring substrates were formed of a four-layered multilayered wiring substrate, and were constructed by four insulating layers 115 and four wiring layers 116, 117. Also, all thicknesses T2 of the insulating layers 115 were equal and were set to 30 μm respectively, and the thickness of the ordinary wiring layer 116 was set to 12 μm.

Figure 5:
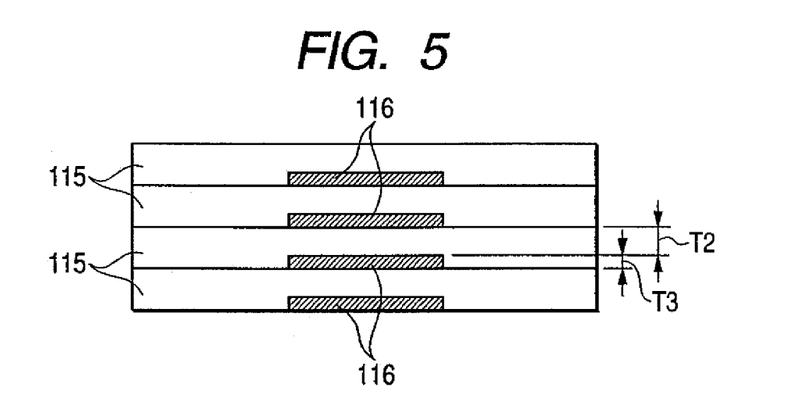
FIG. 5 is a schematic configurative view showing a multilayered wiring substrate to which no reinforcing wiring layer is provided.

Also, in FIG. 2 to FIG. 4, the characteristic indicated by an arrow A corresponds to the characteristic obtained when the thicknesses of all wiring layers 116 were set equal (set to 12 μm that is a normal thickness), as shown in FIG. 5. This multilayered wiring substrate has an equivalent configuration to the multilayered wiring substrate in the related art. Also, in FIG. 2 to FIG. 4, the characteristic indicated by an arrow B corresponds to the characteristic obtained when the thickness of the reinforcing wiring layer 117 was set to 18 μm, the characteristic indicated by an arrow C corresponds to the characteristic obtained when the thickness of the reinforcing wiring layer 117 was set to 35 μm, and the characteristic indicated by an arrow D corresponds to the characteristic obtained when the thickness of the reinforcing wiring layer 117 was set to 150 μm.

When the characteristics shown in FIG. 2 to FIG. 4 were examined, the characteristic of the multilayered wiring substrate equivalent to the related art (the characteristic indicated by an arrow A) was defective in all Figures. A large warpage in excess of 600 μm was generated in the multilayered wiring substrate. Also, in the characteristic indicated by an arrow B and obtained when the thickness of the reinforcing wiring layer 117 was set to 18 μm, the improvement of the characteristic appeared slightly in the multilayered wiring substrate shown in FIG. 3 and FIG. 4, but generation of the warpage was not satisfactorily suppressed yet.

In contrast, in the characteristic indicated by an arrow C and obtained when the thickness of the reinforcing wiring layer 117 was set to 35 μm, it was understood that an amount warpage is reduced considerably in all of FIG. 2 to FIG. 4. Also, even when the thickness of the reinforcing wiring layer 117 was set to 150 μm, generation of the warpage was never largely suppressed as indicated by an arrow D rather than the warpage indicated by the arrow C and generated in the 35 μm thickness.

As described above, an effect of reducing the warpage was increased as the thickness of the reinforcing wiring layer 117 was increased. However, when the actual warpage reducing effect and a productivity of the multilayered wiring substrate (a time and a cost are consumed much more to form the thicker wiring layers) are considered and also the characteristics shown in FIG. 2 to FIG. 4 are considered, it is desired that the thickness T1 of the reinforcing wiring layer 117 provided to suppress the generation of the warpage of the multilayered wiring substrate should be set to 35 to 150 μm. In addition, when such a situation is considered that the warpage characteristic remains on the almost same level when the thickness of the reinforcing wiring layer 117 is in excess of 35 μm, preferably the thickness T1 of the reinforcing wiring layer 117 should be set to 35 to 70 μm.

Also, in comparison with the characteristic shown in FIG. 2, the characteristic shown in FIG. 3 shows the better characteristic. This is because, in the multilayered wiring substrate shown in FIG. 7 corresponding to the characteristic in FIG. 3, the reinforcing wiring layer 117 is arranged in the second lowermost layer and thus the reinforcing wiring layer 117 is positioned closer to a center position of the multilayered wiring substrate. In this manner, because the reinforcing wiring layer 117 acting as the reinforcing member is positioned in a center position of the multilayered wiring substrate or in a position close to the center, a vertical balance around the reinforcing wiring layer 117 is improved and accordingly the generation of the warpage can be suppressed.

Also, in comparison with the characteristic shown in FIG. 2, the characteristic shown in FIG. 4 shows the better characteristic. This is because, in the multilayered wiring substrate shown in FIG. 8 corresponding to the characteristic in FIG. 4, a plurality of reinforcing wiring layers 117 are provided. In this manner, because the arranged number of the reinforcing wiring layer 117 serving as the reinforcing member is increased, the mechanical strengths such as a rigidity, and the like are increased and accordingly the generation of the warpage can be suppressed.

Figure 9:
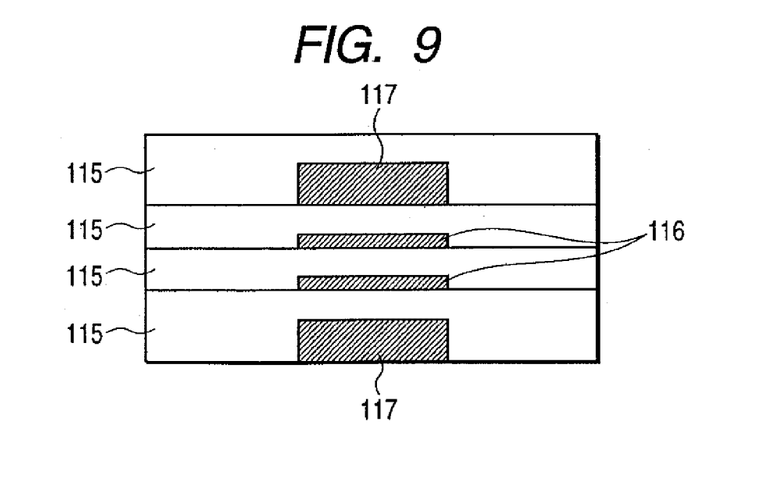
FIG. 9 is a schematic configurative view showing a multilayered wiring substrate in which lowermost and uppermost wiring layers are used as a reinforcing wiring layer.

Therefore, as shown in FIG. 9, because the reinforcing wiring layer 117 is arranged in the uppermost wiring layer and the lowermost wiring layer, a plurality of reinforcing wiring layers 117 are provided and a vertical balance is improved, and accordingly the generation of the warpage can be effectively reduced.

As described above, it is desirable that the thickness T1 of the reinforcing wiring layer 117 provided to suppress the generation of the warpage of the multilayered wiring substrate should be set to 35 to 150 μm. However, even though the reinforcing wiring layer 117 of this thickness is simply provided, the warpage reducing effect is decreased in the situation that the thickness T2 of the insulating layer 115 is thicker than the thickness T1 of the reinforcing wiring layer 117.

Therefore, in order to suppress effectively the warpage generated in the multilayered wiring substrate, it is desired that a ratio (T1/T2) of the thickness T1 of the reinforcing wiring layer 117 to the thickness T2 of the insulating layer 115 should be set to $1 \leq (T1/T2) \leq 5$ and also the reinforcing wiring layer 117 should be set thicker than the insulating layer 115. Accordingly, the warpage generated in the multilayered wiring substrate can be prevented effectively.

The above characteristic is explained by taking the multilayered wiring substrate formed as the four-layered structure as an example. But the above explanation is similarly true of the multilayered wiring substrate having other number of layers.

In turn, a method of manufacturing the multilayered wiring substrate according to the present invention will be explained hereunder. In the following explanation, the method of manufacturing the multilayered wiring substrate 100 shown in FIG. 1 is taken as an example.

FIG. 10A to FIG. 13 show the method of manufacturing the multilayered wiring substrate 100 in line with manufacturing procedures. In FIG. 10A to FIG. 13, the reference symbols are affixed to the configurations corresponding to those shown in FIG. 1.

Figure 10A:
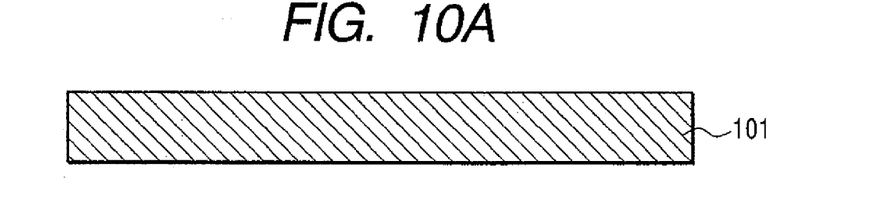

In manufacturing the multilayered wiring substrate 100, first a supporting substrate 101 shown in FIG. 10A is prepared. This supporting substrate 101 is formed of conductive material such as Cu, or the like, for example. A barrier film (not shown) such as a Ni film, or the like is formed previously on an upper surface of the supporting substrate 101 (surface on which the multilayered wiring substrate 100 is formed).

A film-like resist 113 made of a photosensitive resin material is provided on the supporting substrate 101. As a thickness of the resist film 113, a thickness that is thicker than at least 35 to 150 μm as a thickness of the reinforcing wiring layer 103 is selected.

Then, the resist film 113 is patterned by irradiating a light via a mask pattern (not shown) to expose. Thus, opening portions are formed in positions where the reinforcing wiring layer 103 is formed. The supporting substrate 101 is exposed from the opening portions.

Figure 10B:
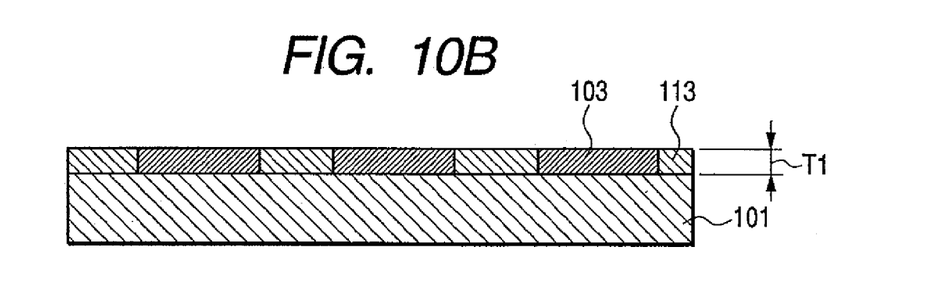

Then, the copper (Cu) is deposited on the opening portions formed in the resist film 113 by applying the electroplating while using the supporting substrate 101 as a power feeding path. Thus, the reinforcing wiring layers 103 are formed. FIG. 10B shows a state that the reinforcing wiring layers 103 are formed.

At this time, a thickness of the reinforcing wiring layers 103 is controlled in a range of 35 to 150 μm by executing a management of a plating time, and the like. In the plating method, it is commonly executed to control a thickness of the plated metal. Therefore, it can be carried out easily that the thickness of the reinforcing wiring layer 103 is set to 35 to 150 μm, which is thicker than the thickness (12 μm) of the common wiring layer, during its plating. Then, the resist film 113 is removed after the reinforcing wiring layer 103 is formed.

Figure 10C:
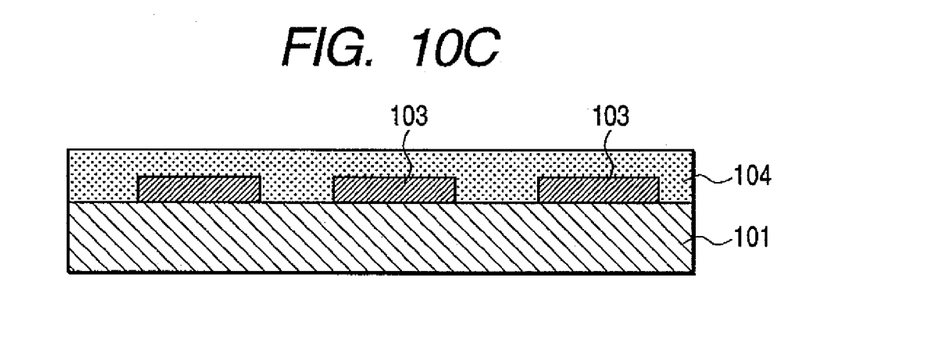

Then, the first insulating layer 104 and the wiring 105 are formed. First, as shown in FIG. 1C, the first insulating layer 104 (built-up layer) is formed on the supporting substrate 101 and the reinforcing wiring layers 103 by coating a resin such as a thermosetting epoxy resin, or the like or laminating a resin film. Then, as shown in FIG. 10D, the opening portions 104A (via holes) are formed in the first insulating layer 104 by using a laser, for example.

Figure 11A:
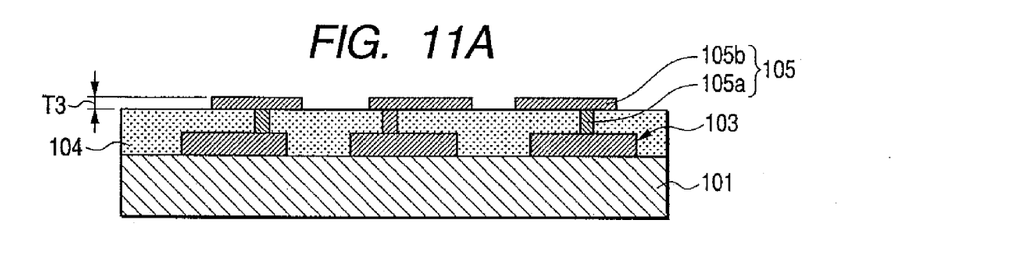
FIGS. 11A to 11D are views (#2) explaining the method of manufacturing the multilayered wiring substrate as the embodiment of the present invention along manufacturing procedures.

Then, the wirings 105 are formed on the first insulating layer 104 by using the plating method. In other words, the via plug portions 105a are formed in the opening portions 104A in the first insulating layer 104, and also the pattern wiring portions 105b connected to the via plug portions 105a are formed on the first insulating layer 104. FIG. 11A shows a state that the wirings 105 are formed. At this time, a thickness of the pattern wiring portion 105b is set to about 12 μm as the thickness of the common wiring layer.

Concretely, a seed layer is formed on the first insulating layer 104 by the Cu electroless plating, and then a resist pattern (not shown) is formed on the first insulating layer 104 by the photolithography method. Then, Cu is deposited by the electroplating while using the resist pattern as a mask, and then the resist pattern and the unnecessary seed layer are removed. Accordingly, the wirings 105 consisting of the via plug portion 105a and the pattern wiring portion 105b respectively are formed.

Figure 11B:
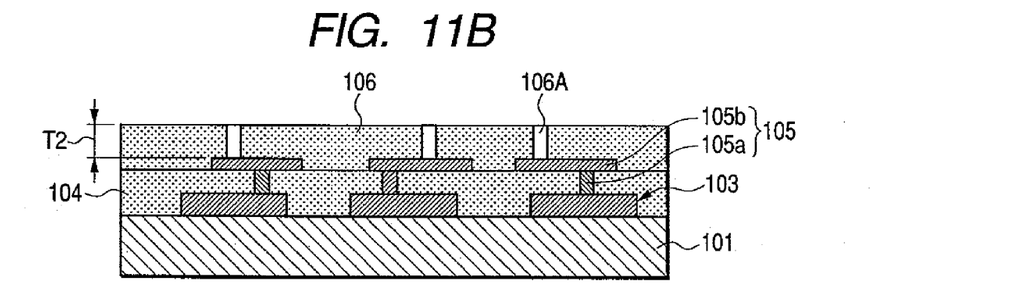

Then, the process of forming the second insulating layer 106 and the wirings 108 on the first insulating layer 104 is executed. This formation of the second insulating layer 106 and the wirings 108 is executed by using the same approach as the process of forming the first insulating layer 104 and the wirings 105. In other words, the second insulating layer 106 (built-up layer) is formed on the first insulating layer 104 and the pattern wiring portions 105b by coating a resin such as a thermosetting epoxy resin, or the like or laminating a resin film. Then, as shown in FIG. 11B, the opening portions 106A (via holes) are formed in the second insulating layer 106 by using the laser, for example.

Then, the wirings 108 are formed on the second insulating layer 106 by using the plating method. In other words, a seed layer is formed on the second insulating layer 106 by the Cu electroless plating, and then a resist pattern (not shown) is formed on the second insulating layer 106 by the photolithography method.

Figure 11C:
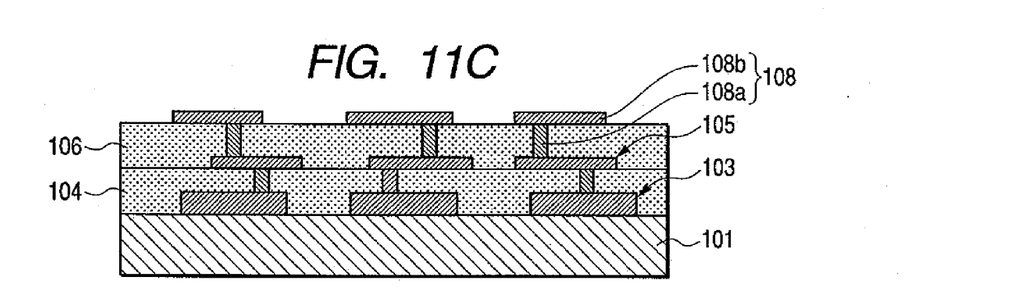

Then, Cu is deposited by the electroplating while using the resist pattern as a mask, and then the resist pattern and the unnecessary seed layer are removed. Accordingly, the wirings 108 consisting of the via plug portion 108a and the pattern wiring portion 108b (a thickness is about 12 μm) respectively are formed on the second insulating layer 106. FIG. 11C shows a state that the wirings 108 are formed.

Figure 11D:
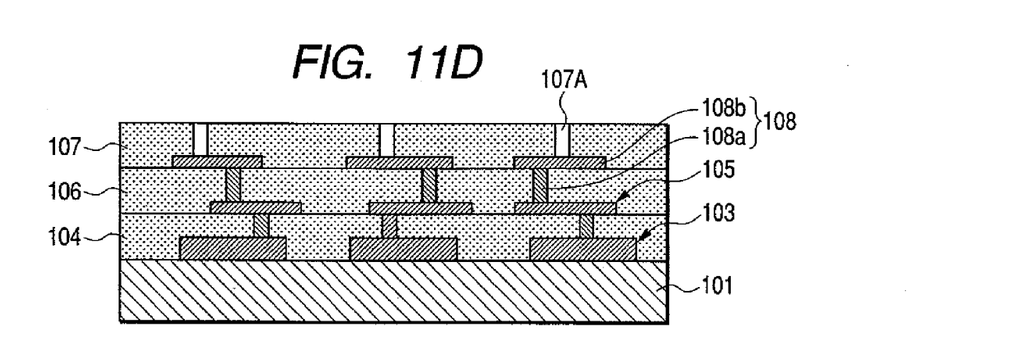

Then, the process of forming the third insulating layer 107 and the wirings 110 is executed. This formation of the third insulating layer 107 and the wirings 110 is executed by using the same approach as the process of forming the first insulating layer 104 and the wirings 105. In other words, the third insulating layer 107 (built-up layer) is formed on the second insulating layer 106 and the pattern wiring portions 108b by coating a resin such as a thermosetting epoxy resin, or the like or laminating a resin film. Then, as shown in FIG. 11D, the opening portions 107A (via holes) are formed in the third insulating layer 107 by using the laser, for example.

Then, the wirings 110 are formed on the third insulating layer 107 by using the plating method. In other words, a seed layer is formed on the third insulating layer 107 by the Cu electroless plating, and then a resist pattern (not shown) is formed on the third insulating layer 107 by the photolithography method.

Figure 12A:
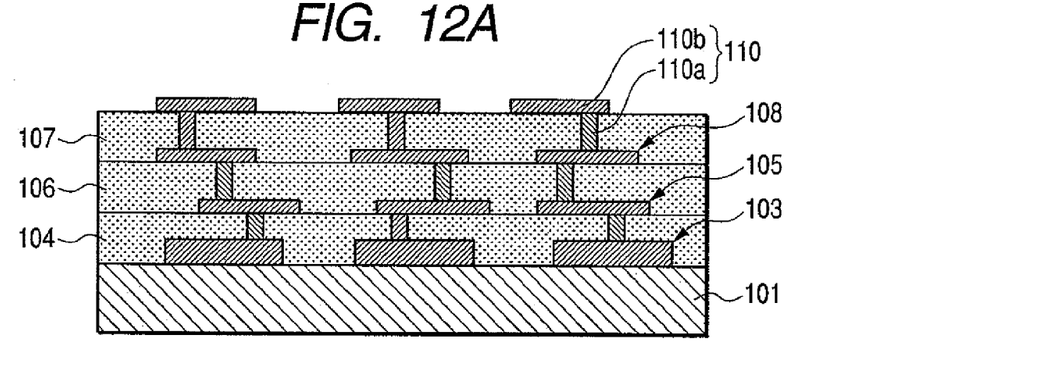
FIGS. 12A to 12C views (#3) explaining the method of manufacturing the multilayered wiring substrate as the embodiment of the present invention along manufacturing procedures.

Then, Cu is deposited by the electroplating while using the resist pattern as a mask, and then the resist pattern and the unnecessary seed layer are removed. Accordingly, the wirings 110 consisting of the via plug portion 110a and the pattern wiring portion 110b (a thickness is about 12 μm) respectively are formed on the third insulating layer 107. FIG. 12A shows a state that the wirings 110 are formed.

Figure 12B:
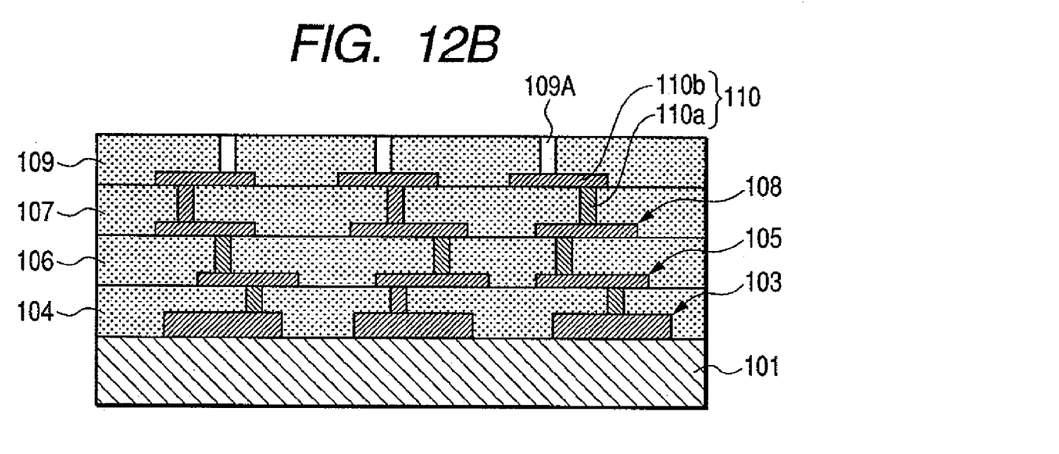

Then, the process of forming the fourth insulating layer 109 and the wirings 112 is executed. This formation of the fourth insulating layer 109 and the wirings 112 is executed by using the same approach as the process of forming the first insulating layer 104 and the wirings 105. In other words, the fourth insulating layer 109 (built-up layer) is formed on the third insulating layer 107 and the pattern wiring portions 110b by coating a resin such as a thermosetting epoxy resin, or the like or laminating a resin film. Then, as shown in FIG. 12B, the opening portions 109A (via holes) are formed in the fourth insulating layer 109 by using the laser, for example.

Then, the wirings 112 are formed on the fourth insulating layer 109 by using the plating method. In other words, a seed layer is formed on the fourth insulating layer 109 by the Cu electroless plating, and then a resist pattern (not shown) is formed on the fourth insulating layer 109 by the photolithography method.

Figure 12C:
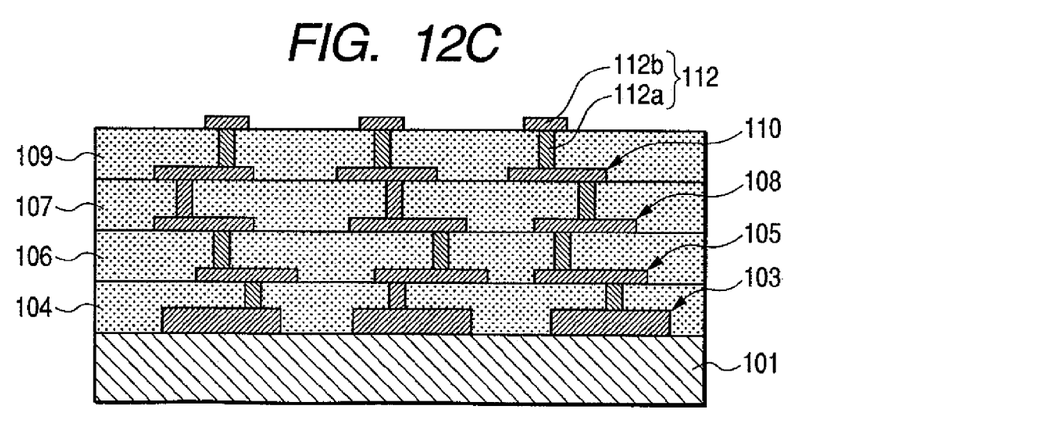

Then, Cu is deposited by the electroplating while using the resist pattern as a mask, and then the resist pattern and the unnecessary seed layer are removed. Accordingly, the wirings 112 consisting of the via plug portion 112a and the pattern wiring portion 112b (a thickness is about 12 μm) respectively are formed on the fourth insulating layer 109. FIG. 12C shows a state that the wirings 112 are formed.

Then, the supporting substrate 101 is removed by the etching (e.g., wet etching) from the state shown in FIG. 12C. This etching process is executed by using an etching solution that cannot dissolve the above barrier film (Ni film) but dissolve the supporting substrate 101 only.

Figure 13:
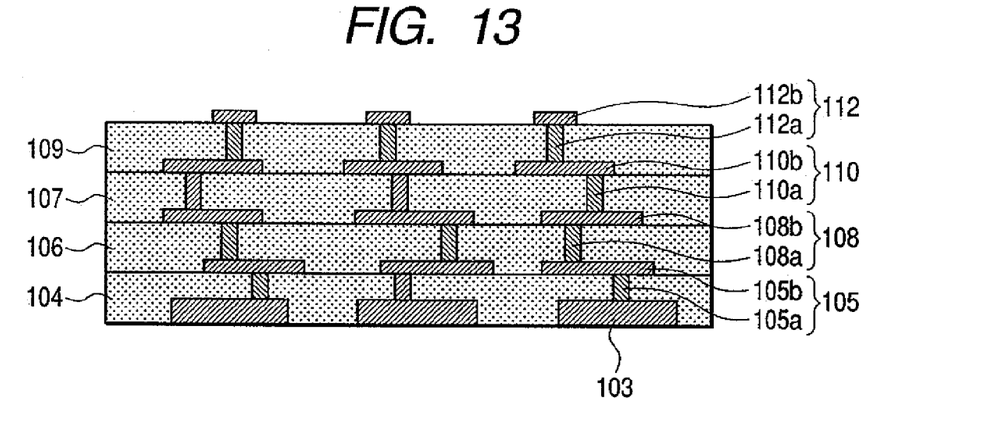
FIG. 13 is a view (#4) explaining the method of manufacturing the multilayered wiring substrate as the embodiment of the present invention along manufacturing procedures.

At this time, since the etching is carried out while covering an overall upper surface of the fourth insulating layer 109 with the resist, or the like, the pattern wiring portions 112b are never damaged by the etching. This etching of the supporting substrate 101 is finished in a condition that the barrier film is exposed, and then the etching process is carried out to remove only the barrier film. FIG. 13 shows a state that the supporting substrate 101 and the barrier film are removed.

In case the semiconductor element is mounted on the multilayered wiring substrate, the semiconductor element and the electronic parts may be mounted on the pattern wiring portions 120b before the supporting substrate 101 is removed, and then the supporting substrate 101 may be removed.

Then, the solder resists 102, 120 are formed on the lower surface of the first insulating layer 104 and the upper surface of the fourth insulating layer 109 by the screen printing method, or the like. Then, the solder resists 102, 120 are patterned by irradiating a light via a mask pattern (not shown) to expose. Thus, the opening portions 102A, 120A are formed.

The positions where the opening portions 102A are formed are selected to oppose to the reinforcing wiring layers 103, and the positions where the opening portions 120A are formed are selected to correspond to the positions of the pattern wiring portions 112b.

The multilayered wiring substrate 100 shown in FIG. 1 is manufactured by carrying out a series of above steps. According to the manufacturing method of the present embodiment, because the thickness of the reinforcing wiring layer 103 is set to 35 to 150 μm, which is thicker than the normal thickness, in the step that is always applied to form the wiring in the steps of manufacturing the multilayered wiring substrate 100, the warpage of the multilayered wiring substrate 100 can be suppressed. Therefore, since there is no need to modify the manufacturing steps and the manufacturing equipment, the multilayered wiring substrate 100 with no generation of the warpage can be manufactured at a low cost. In addition, the so-called coreless structure from which the supporting substrate 101 is removed is accomplished by the manufacturing method of the multilayered wiring substrate 100 according to the present embodiment. As a result, a reduction in thickness of the multilayered wiring substrate 100 can be achieved.

In the above embodiment, the case where the surface of the multilayered wiring substrate 100 on the fourth insulating layer 109 side is used as the surface on which the semiconductor element is mounted and also the surface of the multilayered wiring substrate 100 on the first insulating layer 104 side is used as the surface on which the external connection terminals are provided is explained. But the surface on the first insulating layer 104 side may be used as the surface on which the semiconductor element is mounted, and also the surface on the fourth insulating layer 109 side may be used as the surface on which the external connection terminals are provided.

Also, the multilayered wiring substrate 100 of the present embodiment is not limited to the application as the substrate on which the semiconductor element is mounted, and can be applied widely to the substrate on which various electronic elements and electronic parts are mounted.

Also, in the method of manufacturing the multilayered wiring substrate 100, for convenience of illustration, the procedures of manufacturing one multilayered wiring substrate 100 from one supporting substrate 101 are illustrated and explained. Actually the so-called gang printing is applied. That is, a large number of multilayered wiring substrates 100 are formed by printing a large number of multilayered wiring substrates 100 on one supporting substrate 101 and then cutting the substrate 101 into individual pieces. Accordingly, the improvement of a manufacturing efficiency can be achieved.

Also, in the present embodiment, the method of manufacturing the multilayered wiring substrate 100 by using a sheet of supporting substrate 101 is shown. However, as disclosed in Patent Literature 1, for example, two sheets of supporting substrates may be used and then the multilayered wiring substrate may be formed on a composite substrate that is obtained by staking two sheets of supporting substrates. In the case of this configuration, the supporting body side acts as the surface on which the semiconductor element is mounted. Also, as the multilayered wiring substrate disclosed in Patent Literature 2, the supporting body side acts as the surface on which the external connection terminals are provided.

In addition, a higher density and a finer pattern of the wiring layers (wiring patterns) can be attained as a thickness of the wiring layers becomes thinner. Therefore, in case the configuration of the multilayered wiring substrate in the above embodiment shown in FIG. 6 and FIG. 8 is applied to the manufacturing method disclosed in Patent Literatures 1, 2, preferably the reinforcing wiring layer 117 should be formed on the side on which the external connection terminals are formed.

In other words, in the semiconductor element mounting surface and the external connection terminal surface, the surface on which the semiconductor element that is miniaturized in contrast to the solder balls, or the like is mounted must be miniaturized. The above configuration can respond to such miniaturization. Concretely, when the configuration of the multilayered wiring substrate shown in FIG. 6 is applied to Patent Literature 1, preferably the wiring layer and the insulating layer should be stacked on the supporting body and then the wiring layer formed at the last should be used as the reinforcing wiring layer. Also, when the configuration of the multilayered wiring substrate shown in FIG. 6 is applied to Patent Literature 2, preferably the wiring layer formed at first on the supporting body should be used as the reinforcing wiring layer.

What is claimed is:

1. A multilayered wiring substrate comprising:
   wiring layers and insulating layers which are stacked in predetermined number to form a multilayer structure,
   wherein at least one of the wiring layers is formed as a reinforcing wiring layer whose thickness is greater than 35 μm to less than 70 μm,
   wherein the thickness of a said wiring layer other than the reinforcing wiring layer is 10 μm to 20 μm,
   wherein the thickness of a said insulating layer, which is measured between a said wiring layer on the top of that said insulating layer and a said wiring layer on the bottom of that said insulating layer, is 30 μm to 40 μm, and
   wherein the thickness of the reinforcing wiring layer is larger than that of the other wiring layers, and a ratio (T1/T2) of the reinforcing wiring layer to the insulating layer is set to $1 \leq (T1/T2) \leq 5$, where T1 is a thickness of the reinforcing wiring layer and T2 is a thickness of the insulating layer.

2. The multilayered wiring substrate according to claim 1, wherein the insulating layer is formed of a resin.

3. The multilayered wiring substrate according to claim 1, wherein the reinforcing wiring layer is formed of a copper.

4. The multilayered wiring substrate according to claim 1, wherein the reinforcing wiring layer is positioned in a center position of the multilayered wiring substrate or in a position close to the center.

5. The multilayered wiring substrate according to claim 1, wherein the uppermost wiring layer and the lowermost wiring layer are formed as the reinforcing wiring layer.

6. The multilayered wiring substrate according to claim 1, wherein the reinforcing wiring layer is a connection terminal.

* * * * *